(12) United States Patent
Takenaka et al.

(10) Patent No.: US 7,525,224 B2
(45) Date of Patent: *Apr. 28, 2009

(54) DRIVE UNIT AND INVERTER WITH COOLING TECHNIQUE

(75) Inventors: Masayuki Takenaka, Aichi-ken (JP); Naruhiko Kutsuna, Aichi-ken (JP); Kozo Yamaguchi, Aichi-ken (JP)

(73) Assignee: Aisin AW Co., Ltd., Aichi-ken (JP)

( * ) Notice: Subject to any disclaimer, the term of this patent is extended or adjusted under 35 U.S.C. 154(b) by 413 days.

This patent is subject to a terminal disclaimer.

(21) Appl. No.: 10/501,005

(22) PCT Filed: May 8, 2003

(86) PCT No.: PCT/JP03/05747

§ 371 (c)(1),
(2), (4) Date: Nov. 22, 2004

(87) PCT Pub. No.: WO2004/025807

PCT Pub. Date: Mar. 25, 2004

(65) Prior Publication Data

US 2005/0253465 A1 Nov. 17, 2005

(30) Foreign Application Priority Data

Sep. 13, 2002 (JP) ............................. 2002-269231

(51) Int. Cl.
H02K 9/19 (2006.01)
(52) U.S. Cl. .............................. 310/54; 310/64; 310/89; 310/52
(58) Field of Classification Search ................... 310/64, 310/52, 54, 89
See application file for complete search history.

(56) References Cited

U.S. PATENT DOCUMENTS 5,491,370 A 2/1996 Schneider et al.

(Continued)

FOREIGN PATENT DOCUMENTS

JP 06-326226 A 11/1994

(Continued)

OTHER PUBLICATIONS

Manual translation of JP 11-155,527, "motor with inverter unit", Takashi Nishizawa, Jun. 8, 1999.*

Primary Examiner—Karl I Tamai
(74) Attorney, Agent, or Firm—Sughrue Mion, PLLC

(57) ABSTRACT

A drive unit comprises an electric motor, a drive unit casing 2 accommodating therein the electric motor, an inverter 3 that controls the electric motor, and a flow passage of a refrigerant that cools the inverter. The inverter defines a space R between it and a heat sink 5 integral with a substrate of the inverter, and is mounted to the drive unit casing, the space being communicated to the flow passage of the refrigerant. The heat sink comprises fins 56 that cross the space R, and abuts against the drive unit casing in a state of low thermal conduction. Thereby, the heat sink is effectively cooled by heat exchange with a cooling refrigerant in wide areas. Also, the fins contact with the drive unit casing in a state of low thermal conduction via a heat insulation material, etc., whereby direct heat conduction is avoided and efficient cooling is enabled while temperature gradient conformed to heat-resistant temperatures of the inverter and the electric motor is maintained.

2 Claims, 15 Drawing Sheets

U.S. PATENT DOCUMENTS

| | | | |
|---|---|---|---|
| 5,585,681 A | 12/1996 | Bitsche | |
| 6,039,114 A * | 3/2000 | Becker et al. | 165/170 |
| 6,198,183 B1 | 3/2001 | Baeumel et al. | |
| 6,236,566 B1 | 5/2001 | Regnier et al. | |
| 6,323,613 B1 * | 11/2001 | Hara et al. | 318/471 |
| 7,102,260 B2 * | 9/2006 | Takenaka et al. | 310/64 |
| 2001/0014029 A1 | 8/2001 | Suzuki et al. | |
| 2005/0253465 A1 * | 11/2005 | Takenaka et al. | 310/52 |

FOREIGN PATENT DOCUMENTS

| | | | |
|---|---|---|---|
| JP | 07-38025 A | | 2/1995 |
| JP | 07-288949 A | | 10/1995 |
| JP | 07-298552 A | | 11/1995 |
| JP | 09-182352 A | | 7/1997 |
| JP | 11-155257 | * | 6/1999 |
| JP | 11-225459 A | | 8/1999 |
| JP | 2001-119898 A | | 4/2001 |
| JP | 2001-238405 A | | 8/2001 |
| JP | 2001-238406 A | | 8/2001 |
| JP | 2002-186222 A | | 6/2002 |
| WO | WO 98/28833 A2 | | 7/1998 |
| WO | WO 02/27895 A1 | | 4/2004 |

* cited by examiner

DRIVE UNIT AND INVERTER WITH COOLING TECHNIQUE

TECHNICAL FIELD

The present invention relates to a drive unit that uses an electric motor as a power source, and, more particular, to a cooling technique in drive units for electric cars and drive units for hybrid cars.

BACKGROUND ART

In the case where an electric motor is used as a power source for vehicles, the electric motor needs a control device (an inverter in the case of an AC electric motor) for control thereof. Since the control device such as inverters, etc. is connected to the electric motor by way of power cable, it can be arranged in an appropriate position apart from the electric motor. For the convenience for a car-mounted arrangement, there is in some cases adopted an arrangement, in which the control device is united with a drive unit, in which the electric motor is built.

By the way, control devices in current technology are lower in heat-resistant temperature than electric motors. Hereupon, in the case where a control device is to unite with a drive unit, in which an electric motor is built, in the above-mentioned manner, certain means that cuts off direct heat conduction from the electric motor to the control device is needed in order to protect the control device. Also, since the control device is raised in temperature due to heat generation by its elements, cooling is necessary in order to maintain the control device at the heat-resistant temperature thereof or lower.

Under such situation, the pamphlet of International Publication No. 98/28833 conventionally proposes an electric motor united with a control device, in which a groove is formed on an outer periphery of a stator body of the electric motor and a bottom plate mounting thereon a module of the control device closes an opening side of the groove to provide a cooling path. In this technique, a cooling flange is formed to extend into the groove on a side of the bottom plate.

Also, a similar technique to the above one is described in U.S. Pat. No. 5,491,370. The technique adopts a construction, in which a spiral passage for flowing of a cooling fluid is formed on an outer periphery of a housing of an electric motor and an IGBT module (inverter component) is mounted to a sleeve that is externally mounted on the housing in a manner to cover an opening surface side of the passage.

Hereupon, with the conventional construction of the former technique, since formation of the cooling flange leads to enlargement of a heat exchange area on a side of the bottom plate that mounts thereto the module, cooling on a side of the module is expedited but cooling on a side of the stator body is not necessarily adequate since a heat exchange area is defined by an area of the groove bottom surface. Accordingly, with such construction, for the purpose of preventing heat on the side of the stator body from being transferred to the module side via the cooling flange, it is required that a tip end of the cooling flange be made apart to some extent from the groove bottom surface of the stator body and the heat insulation effect by a cooling fluid be ensured by a gap therebetween. And, in the case where such gap is made large, the effect of the cooling flange as a flow passage guide is decreased.

On the other hand, with the latter technique, since it is difficult to ensure a sufficient area, in which the sleeve contacts with the cooling fluid, there is a need of increasing the flow rate of a cooling fluid flowing through the spiral path in order to adequately cool inverter components, in which case a pump, etc. for circulation of the cooling fluid becomes large in size and so energy for driving thereof is increased. Also, with the technique, since a tipend of the wall that defines the spiral path is brought in direct contact with the sleeve, heat conduction is caused at such contact region, so that in order to maintain the inverter components at the heat-resistant temperature thereof or lower, there is a need of cooling that lowers temperature of the housing of the electric motor substantially to such temperature, which is not efficient in terms of cooling efficiency.

The invention has been thought of taking account of such conventional techniques, and has its main object to ensure a maximum heat radiation area for a refrigerant within a limited cooling space in a drive unit, in which an inverter is united with an electric motor, while restricting heat conduction from the electric motor to the inverter. Subsequently, it is a further object of the invention to expedite flow of a refrigerant by means of heat radiation means within the cooling space to enhance the cooling capacity.

DISCLOSURE OF THE INVENTION

In order to attain the above objects, the invention has a first feature in a drive unit including an electric motor, a drive unit casing accommodating therein the electric motor, an inverter that controls the electric motor, and a flow passage of a refrigerant that cools the inverter, and wherein the inverter is mounted on the drive unit casing such that a heat sink united with a substrate of the inverter defines a space on a portion thereof opposed to the drive unit casing, the space is communicated to the flow passage of the refrigerant, the heat sink comprises heat-sink side fins extending into the space toward the drive unit casing, and the drive unit casing contact with the heat-sink side fins in a state of low thermal conduction.

With such construction, since the heat-sink side fins extend to positions in contact with the drive unit casing to ensure for the heat sink a sufficient heat transfer area with a refrigerant that flows in the space, expedited cooling caused by heat exchange with a cooling medium in a large area enables effectively cooling the inverter that is united with the drive unit and disadvantageous in terms of heat-resistant temperature. Also, the heat-sink side fins contact with the drive unit casing in a state of low thermal conduction whereby direct heat conduction from the drive unit casing to the heat sink is avoided, so that it is not required that temperature on a side of the drive unit casing be lowered to the heat-resistant temperature of the inverter on a side of the heat sink, and so efficient cooling with temperature gradient maintained between the both is made possible. Thereby, temperature rise of the inverter due to unification of the electric motor and the inverter can be efficiently prevented with less flow rate of the refrigerant.

Next, the invention has a second feature in a drive unit including an electric motor, a drive unit casing accommodating therein the electric motor, an inverter that controls the electric motor, and a flow passage of a refrigerant that cools the inverter, and wherein the inverter is mounted on the drive unit casing such that a heat sink united with a substrate of the inverter defines a space on a portion thereof opposed to the drive unit casing, the space is communicated to the flow passage of the refrigerant, the heat sink comprises heat-sink side fins extending into the space toward the drive unit casing, separation means is provided in the space to prevent heat conduction, and both the heat-sink side fins and the drive unit casing contact directly with the separation means.

With such construction, since the heat-sink side fins extend to positions in contact with the separation means toward the drive unit casing to thereby ensure for the heat sink a sufficient heat transfer area with a refrigerant that flows in the space, expedited cooling caused by heat exchange with a cooling medium in a large area enables effectively cooling the inverter that is united with the drive unit and disadvantageous in terms of heat-resistant temperature. Also, the heat-sink side fins contact with the drive unit casing through the separation means that prevents heat conduction, whereby direct heat conduction from the drive unit casing to the heat sink is avoided, so that it is not required that temperature on a side of the drive unit casing be lowered to the heat-resistant temperature of the inverter on a side of the heat sink, and so efficient cooling with temperature gradient maintained between the both is made possible. Thereby, temperature rise of the inverter due to unification of the electric motor and the inverter can be efficiently prevented with less flow rate of the refrigerant.

According to the second feature, the separation means can be composed of a low thermal conductive member. With this construction, reduction in volume of the space corresponding to the thickness of the separation means as provided can be restricted to a minimum.

Also, the separation means can also be composed of a plurality of separation members with space therebetween. With this construction, since the spaces between the separation members can be used for heat insulation, a high heat insulating property is not demanded of the members themselves that constitute the separation means, so that selection of materials for the separation members is widened in latitude.

Alternatively, the separation means may be composed of a laminated member that is formed by laminating a low thermal conductive member on a separation member. With such construction, in addition to the effect that temperature rise of the inverter due to unification of the electric motor and the inverter can be efficiently prevented with less flow rate of the refrigerant, the low thermal conductive member separates the heat-sink side fins and the drive unit casing from each other and is backed by the separation member to be able to maintain its shape, so that there is produced an effect that materials having an excellent thermal shielding property can be widely selected for the low thermal conductive member.

Also, the drive unit casing can comprise drive-unit-casing side fins extending into the space toward the heat sink. With such construction, since a large heat transfer area with a refrigerant that flows in the space is also ensured on a side of the drive unit casing, both the heat sink and the drive unit casing can be further effectively cooled.

In this case, it is desired that the space be compartmented by the separation means into a first chamber facing toward the heat sink and a second chamber facing toward the drive unit casing. With such construction, since the space between the heat sink and the drive unit casing is compartmented into a first chamber and a second chamber with the separation means therebetween, both chambers are opposed to each other in a state of thermal insulation, and efficient cooling is made possible with temperature gradient maintained further surely between the both chambers.

In either of the above constructions, the inverter is received in an inverter casing composed of a member separate from the inverter with a substrate thereof fixed to a bottom wall of the inverter casing and can constitute a heat sink, of which a substrate is united with the bottom wall of the inverter casing. Alternatively, the inverter together with a heat sink that is united with a substrate thereof can be received in an inverter casing that is composed of a member separate from the inverter.

Also, the heat-sink side fins and the drive-unit-casing side fins can cooperatively generate a common refrigerant flow pattern within the space. With such construction, since a common refrigerant flow making use of the fins is generated on both the heat sink side and the drive unit casing side within the space, it is possible to prevent stagnation due to interference of the refrigerant flow from being generated in the space.

Also, the low thermal conductive member can be shaped to follow contact portions of the heat-sink side fins and the drive-unit-casing side fins. With such construction, since reduction in volume of the space corresponding to the thickness of the low thermal conductive member as interposed can be restricted to a minimum, the drive unit can be made compact such that the volume of the space is effectively used for a space, in which the refrigerant flows.

BEST MODE FOR CARRYING OUT THE INVENTION

Figure 1:
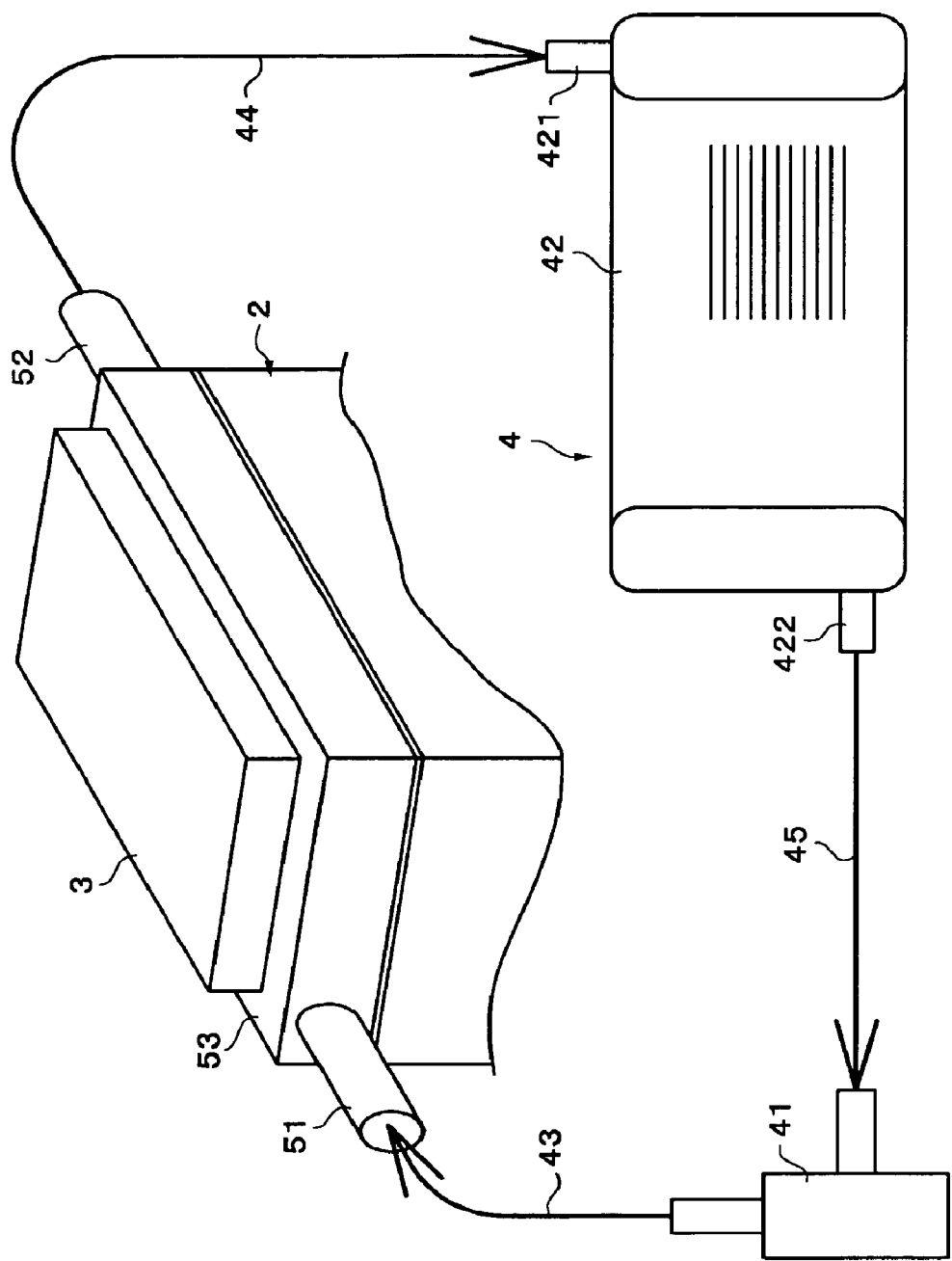
FIG. 1 is a view showing a configuration of a cooling system of a drive unit according to the invention.

Embodiments of the invention will be described below with reference to the drawings. First, FIG. 1 schematically and conceptionally shows a cooling system of a drive unit, to which the invention is applied. The drive unit comprises an electric motor, of which illustration is omitted, a drive unit casing 2 that accommodates therein the electric motor, an inverter 3 that controls the electric motor, and a flow passage 4 of a refrigerant that cools the inverter 3. An inverter referred to in the specification of the present application means a power module composed of a switching transistor and associated circuit elements that convert DC of a battery power source into AC (three-phase AC in the case where the electric motor is a three-phase AC electric motor) under the switching action, and a circuit board arranging thereon the switching transistor and the associated circuit elements. The drive unit in this embodiment constitutes one for electric cars or hybrid cars, and the drive unit casing 2 accommodates therein a motor or a generator or the both thereof as an electric motor (not shown), a differential device, and an accessory mechanism such as counter gear mechanism, etc. A substrate itself of the inverter 3, or a heat sink 53 made integral with the substrate by attaching a separate member to the substrate is mounted to the drive unit casing 2 while a space is defined in a region opposed to the drive unit casing 2, and the space is communicated to the refrigerant flow passage 4. In this embodiment, the refrigerant flow passage 4 makes a refrigerant circulation path, in which a single refrigerant passes through a space between the heat Sink 53 and the drive unit casing 2 to be circulated.

The refrigerant circulation path comprises a water pump 41 as a pressure feed source, a radiator 42 as a heat exchanger, and flow passages 43, 44, 45 connecting the pump and radiator together. In addition, illustration of an accessory equipment such as a drive motor of the water pump 41, etc. is omitted. The discharge-side flow passage 43 of the water pump 41 as a staffing point of the refrigerant circulation path is connected to a port 51 on an inlet side of the heat sink 53, a port 52 on an outlet side of the heat sink 53 is connected to an inlet 421 side of the radiator 42 via the return flow passage 44, and an outlet 422 side of the radiator 42 is connected to the suction-side flow passage 45 of the water pump 41. Accordingly, a cooling water as a refrigerant in the refrigerant circulation path is fed from the water pump 41, then absorbs heat from a module that constitutes the inverter 3 and heat of the drive unit casing 2 to be heated when flowing through the space in the heat sink 53, is fed into the radiator 42 via the return flow passage 44 to be cooled due to radiation of heat to an air, is returned to the water pump 41, terminates a round of cycles, and repeats this circulation. In addition, the refrigerant circulation path can also be made a flow passage in a portion midway, for example, the return flow passage 44, to extend through the drive unit casing 2 for further cooling.

Figure 2:
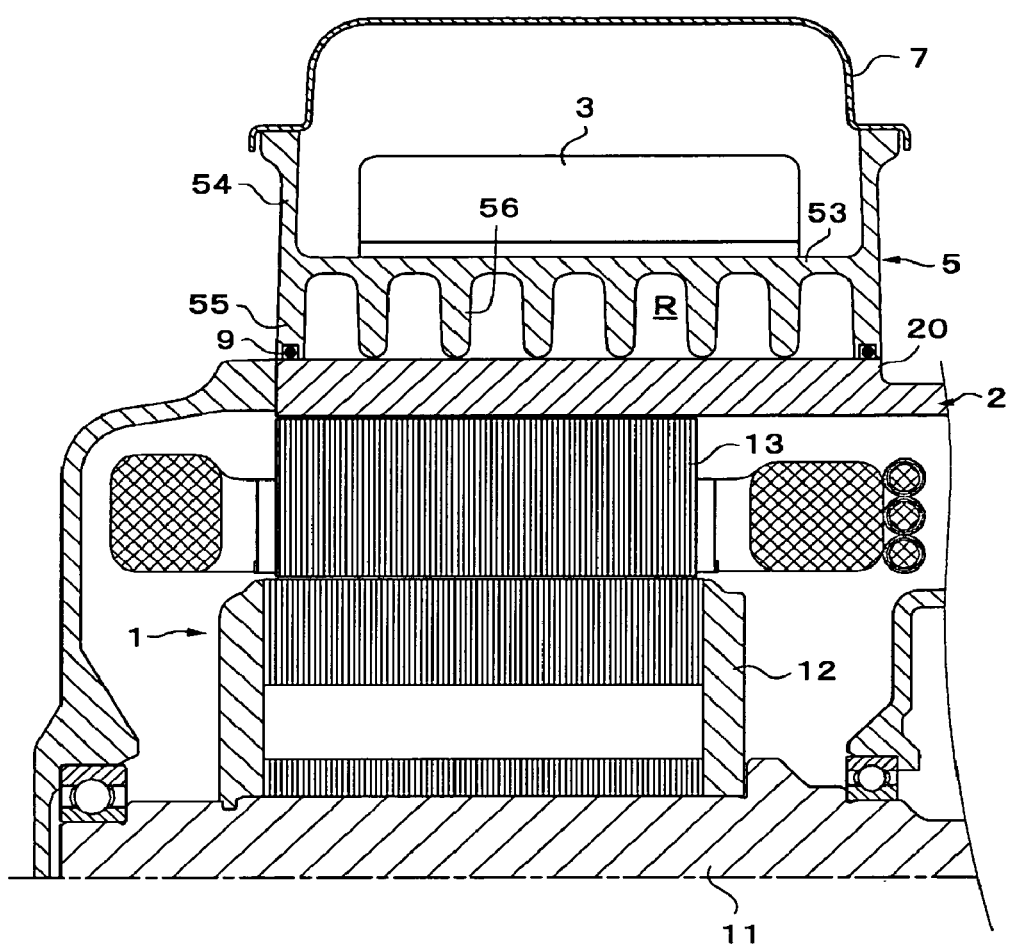
FIG. 2 is a schematic, longitudinal, cross sectional view, in an axial direction, of a drive unit according to a first embodiment.
Figure 3:
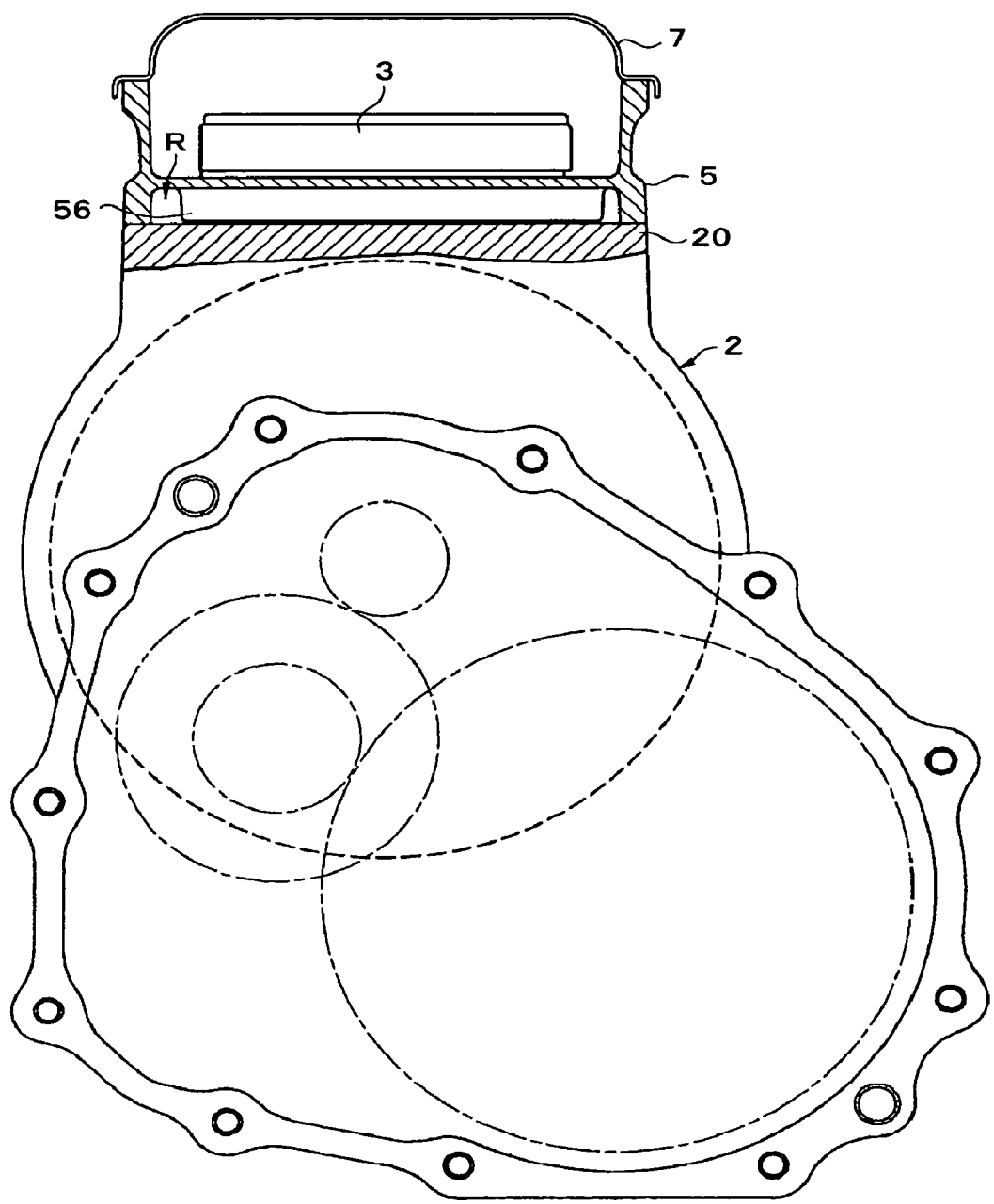
FIG. 3 is a schematic side view showing, partially in section, the drive unit according to the first embodiment as viewed in a direction of shaft end.

Subsequently, FIGS. 2 and 3 show, in a simplified manner, a longitudinal, cross section, in an axial direction, and a side (partially sectioned) as viewed from an axial end, of the drive unit according to a first embodiment. In FIG. 2, the reference numeral 1 denotes an electric motor, 11 a rotor shaft of the motor, 12 a rotor core, and 13 a stator core, and in FIG. 3, a circle shown by a broken line indicates an outside diameter of the electric motor 1, a circle shown by an alternate long and short dash line and having a maximum diameter indicates an intermeshing pitch diameter of a ring gear of the differential device, and respective circles shown by alternate long and short dash lines and having a minimum diameter and a medium diameter indicate intermeshing pitch diameters of respective gears of the counter gear mechanism that transmits power between the rotor shaft 11 and the ring gears of the differential device.

In this embodiment, an inverter 3 is received in an inverter casing 5 composed of a member separate from the inverter with a substrate thereof fixed to a bottom wall 53 of the inverter casing and constitutes a heat sink, of which a substrate is united with the bottom wall 53 of the inverter casing 5. A mount 20 for the inverter casing 5 is formed integral with an upper portion of the drive unit casing 2. The mount 20 for the inverter casing 5 is provided in a manner to project on the upper portion of the casing so as to contact with an outer periphery of an electric motor receiving section, and is in the form of a base, a plane outline of which substantially corresponds to that of the inverter casing 5.

The inverter casing 5 is in the form of a casing provided with a peripheral wall 54 that is rectangular in plan, extends upward from a bottom wall 53 thereof in a manner to surround the outline in a frame-like manner, and has an interior thereof serving as a space that accommodates therein the inverter 3. And, single or plural modules constituting the inverter 3 are tightly fixed by appropriate means to the bottom wall 53 of the inverter casing 5 that is finished flat so as to closely mount thereto the module or modules in a manner not to generate the resistance of heat conduction. And, an upper opening of the inverter casing 5 is closed by a cover 7 so that the inverter 3 therein is protected from rain water and dust. Provided on the bottom wall 53 of the inverter casing 5 is a peripheral wall 55 that is rectangular in plan and extends downward in a manner to surround the outline thereof, whereby a space R is surrounded by the peripheral wall to be defined.

The inverter casing 5 constructed in this manner is fixed integrally by means of appropriate fixation means such as bolting, etc. in a state, in which an end surface of the peripheral wall 55 is caused to abut against a mount surface of the drive unit casing 2, and sealing is applied by a sealing material 9 such as an O-ring or the like at need. While such abutting portions are arranged in direct contact with each other in the illustrated example, an appropriate intermediate member having the function of sealing, or the function of thermal insulation, or the both functions can be interposed between mating surfaces of the inverter casing 5 and the drive unit casing 2 so as to prevent leakage of the refrigerant and thermal conduction at the mount section. While in place of the provision of the sealing material 9 as shown in the drawings, the intermediate member is interposed between the mating surfaces in the case where it is made of a thermal insulating material or a thermal sealing material, the sealing material 9 can be arranged in grooves formed on the respective mating surfaces of the inverter casing 5 and the drive unit casing 2 to seal surfaces that abut against a thermal insulating material interposed between the mating surfaces in the case where the thermal insulating material and the sealing material are separate from each other.

According to a feature of the invention, the heat sink 53 comprises a multiplicity of heat-sink side fins 56 extending into the space R toward the drive unit casing 2 for ensuring a heat exchanging area and substantially crossing the space R in a thicknesswise direction thereof, and the heat-sink side fins 56 and the drive unit casing 2 contact with each other in a state of low thermal conduction. In the embodiment, such contact in a state of low thermal conduction is realized by rounding tip ends of the fins 56 so that the fins come into substantially line contact with the drive unit casing 2 to thereby increase the contact portions in resistance of heat conduction. In addition, the respective fins are shown, in all the drawings that include drawings showing embodiments described later, as being enlarged and exaggerated in dimension relative to the space R, and for the purpose of avoiding complexity in the drawings, the number of the fins is shown as being less than the number of fins actually arranged.

Figure 4:
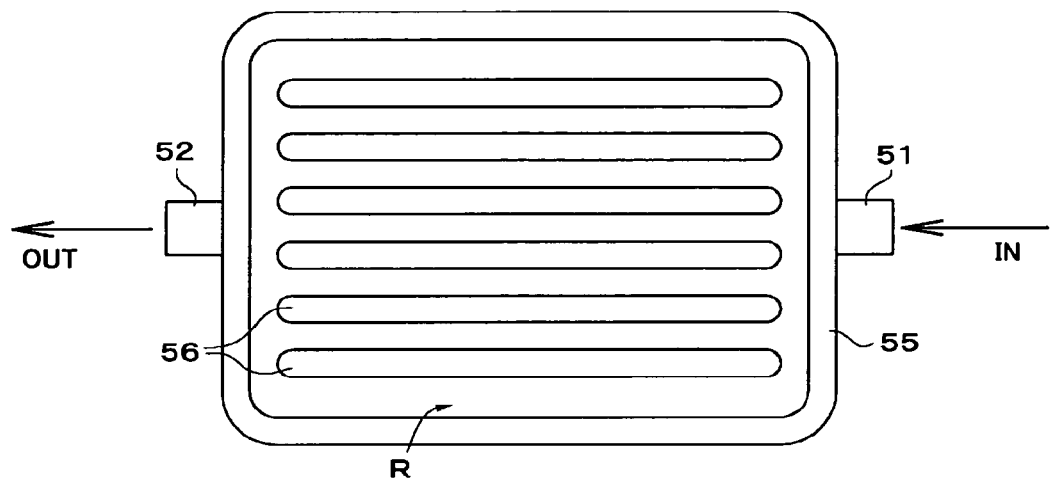
FIG. 4 is a schematic plan view showing a rib-shaped-fin arrangement pattern.

Next, FIG. 4 schematically shows a pattern of arrangement of the heat-sink side fins 56 as viewed in plan. The heat-sink side fins 56 are extended in parallel between the inlet-side port 51 and the outlet-side port 52 and arranged at equal intervals, and both lengthwise ends of the fins terminate with a predetermined gap between them and the peripheral wall 55 so that spaces between the respective fins 56 are communicated to the inlet-side port 51 and the outlet-side port 52. Such arrangement of the fins 56 defines in the space R parallel flow passages, both ends of which are communicated to the inlet-side port 51 and the outlet-side port 52, and which are separated from one another by the fins 56.

Figure 5:
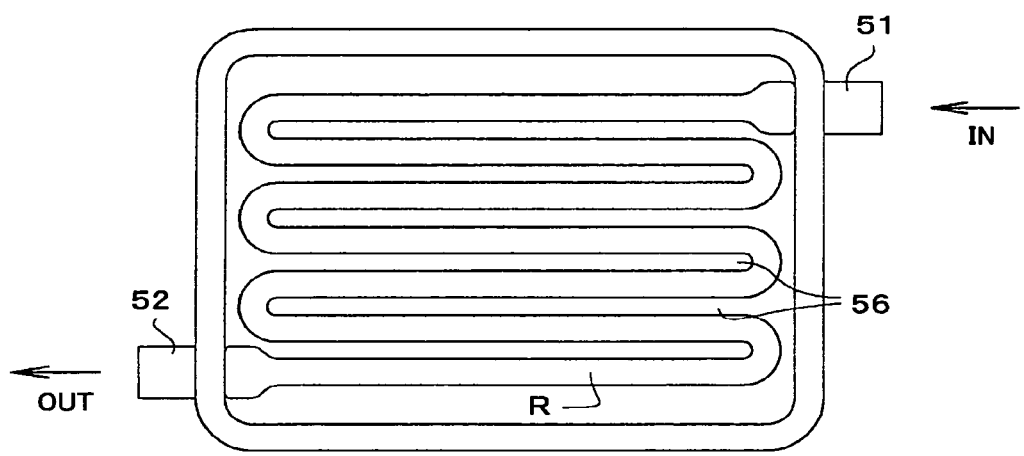
FIG. 5 is a schematic plan view showing a flow-passage forming fin arrangement pattern.

The pattern of arrangement of the fins 56 can adopt other configurations. Next, FIG. 5 shows, in plan, a modified example of a pattern of arrangement of heat-sink side fins 56 in the same manner as in FIG. 4. In this case, the heat-sink side fins 56 constitute a wall that defines a single flow passage meandering in a space R between the inlet-side port 51 and the outlet-side port 52. Such fin arrangement is increased in pressure loss relative to the rib-shaped fin arrangement that constitutes the above parallel flow passages, but is effective in that in the case where a plurality of modules having different heat-resistant temperatures are aligned and arranged on the heat sink, various portions on the heat sink bottom wall 53 can be finely adjusted in temperature by selecting a flow pattern according to positions, in which the modules are arranged.

Figure 6:
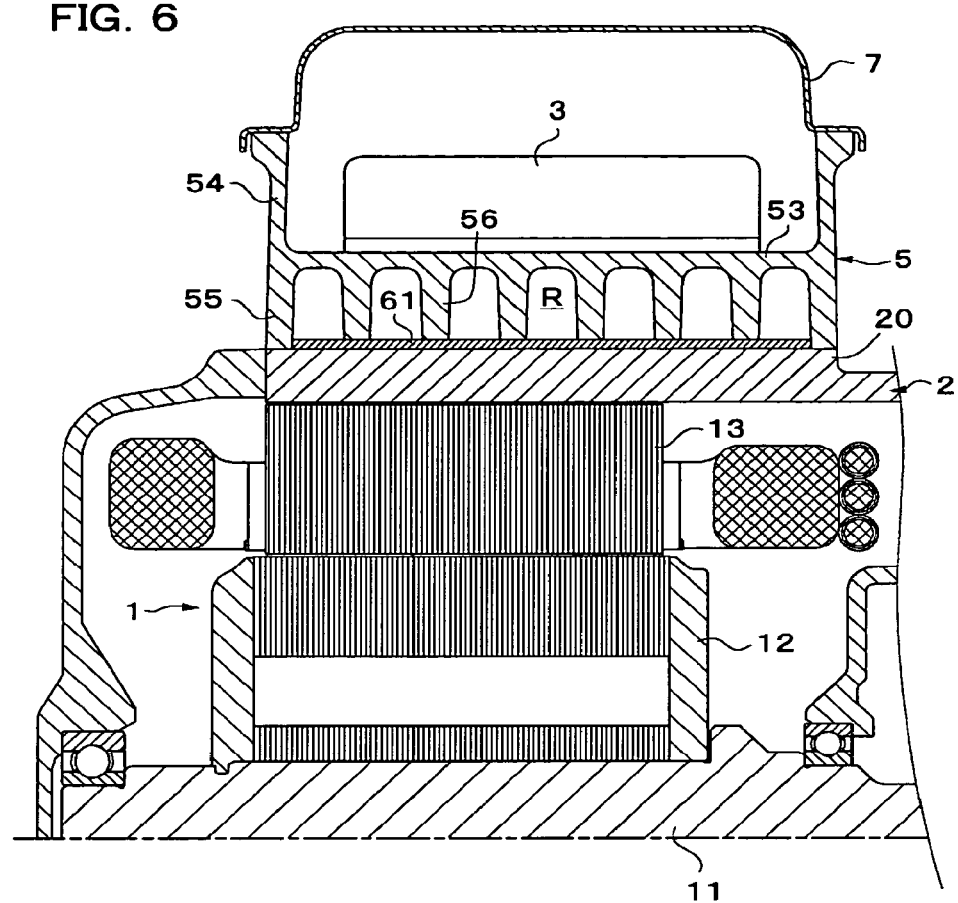
FIG. 6 is a longitudinal, cross sectional view, in an axial direction, of a drive unit according to a second embodiment.

Next, FIG. 6 shows a second embodiment that is the same in fundamental construction as the first embodiment. In this embodiment, a heat sink 53 is the same as in the first embodiment in comprising heat-sink side fins 56 extending into a space R toward a drive unit casing 2, but according to this embodiment a low thermal conductive member 61 made of a material of low thermal conductivity and serving as separation means, that is, a thermal insulating material is provided in the space R and both the heat-sink side fins 56 and the drive unit casing 2 contact directly with the low thermal conductive member 61. The provision of the low thermal conductive member 61 realizes a state of low thermal conduction between the heat-sink side fins 56 and a mount 20 of the drive unit casing 2. In this case, the low thermal conductive member 61 is plate-shaped to have an external dimension covering all over that portion of the mount 20 of the drive unit casing 2, which faces the space R, and is provided along and arranged on the mount 20 of the drive unit casing 2. Since a remaining portion of the construction including a sealed construction of the mating surface portions, of which illustration is omitted, is the same as that in the first embodiment, an explanation is replaced by the same reference numerals that denote corresponding members. This is the same with other following embodiments.

Figure 7:
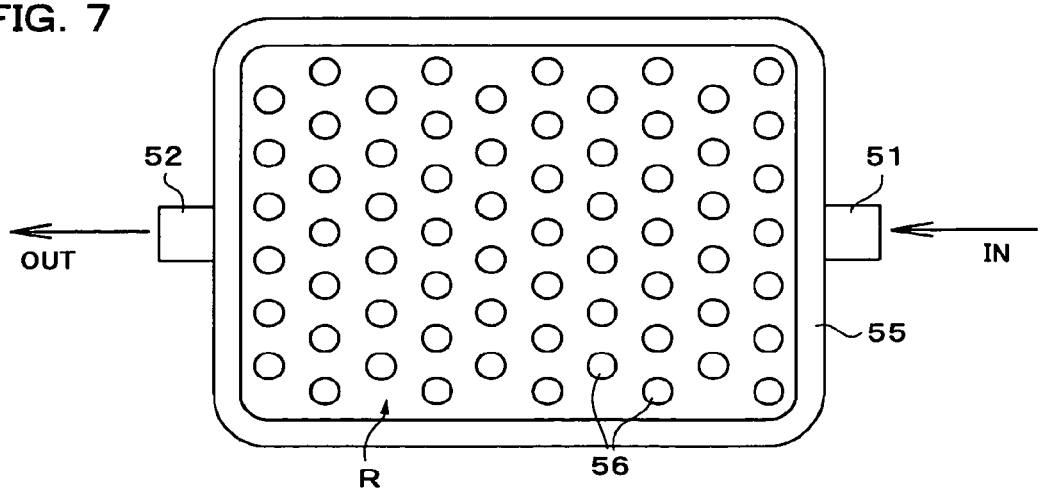
FIG. 7 is a schematic plan view showing a pin-shaped-fin arrangement pattern.

Since according to this embodiment the provision of the low thermal conductive member 61 realizes a state of low thermal conduction, tip ends of the heat-sink side fins 56 are made planar to abut against the low thermal conductive member 61 unlike the previous embodiment. While the heat-sink side fins 56 can adopt the same rib-shaped or flow passage constituting wall arrangement as the patterns of arrangement illustrated in the previous embodiment with reference to FIG. 4 or FIG. 5, the heat-sink side fins 56 can comprise a multiplicity of pin-shaped fins arranged lengthwise and crosswise at a predetermined pitch as shown in a schematic plan of FIG. 7 in the case where natural flow is to be generated in the space R without restriction by fins. Such adoption of pin-shaped fins is advantageous in that pressure loss in the refrigerant flow within the space R can be extremely reduced.

Figure 8:
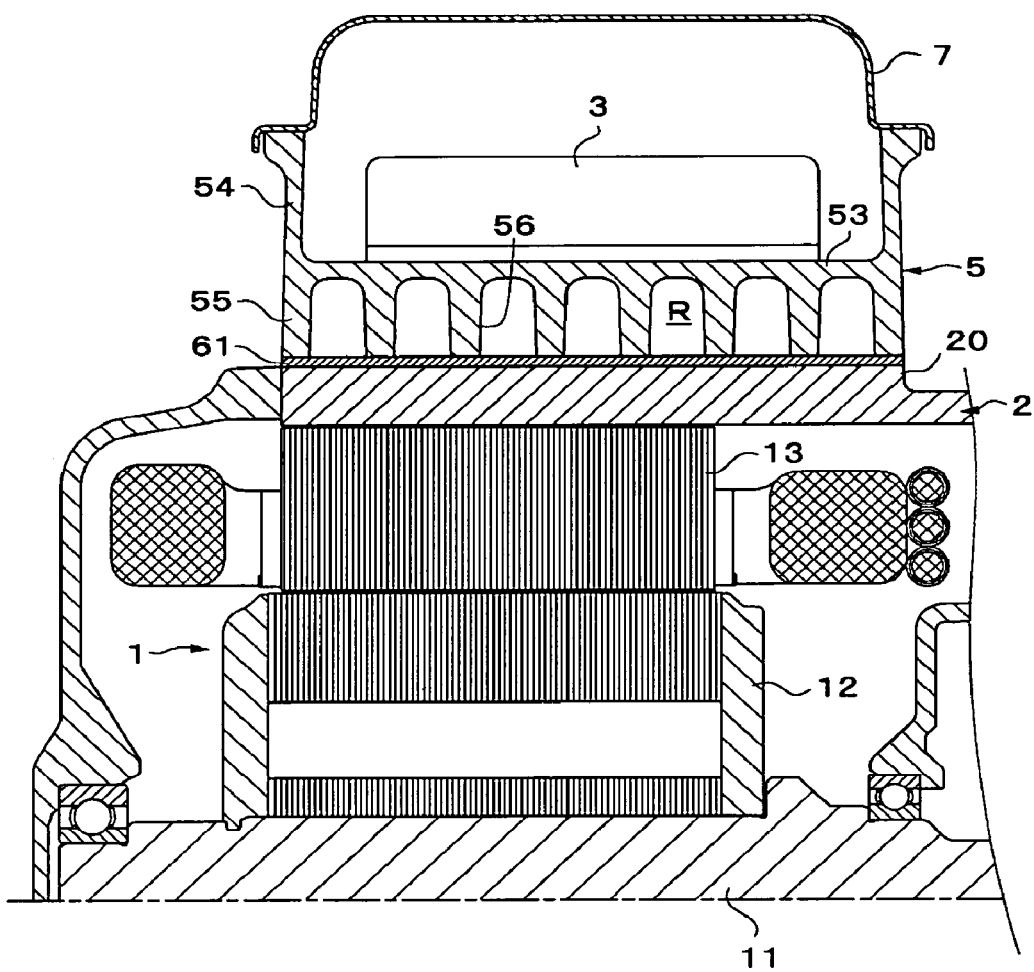
FIG. 8 is a longitudinal, cross sectional view, in an axial direction, of a drive unit according to a third embodiment.

Next, FIG. 8 shows a third embodiment that is the same in fundamental construction as the respective embodiments described previously. In this embodiment, a low thermal conductive member 61 is plate-shaped to have an external dimension covering a mount surface 20 of a drive unit casing 2 including a surface, in which the mount surface mates with a inverter casing 5, and is provided along and arranged on the entire mount surface 20 of the drive unit casing 2. In the case where such construction is adopted, heat transfer on mating surfaces of the drive unit casing 2 and the inverter casing 5, that is, abutting areas of the mount surface 20 of the drive unit casing 2 and an end surface of a inverter-casing peripheral wall 55 is cut off by the low thermal conductive member 6, so that the thermal shielding effect between the drive unit casing 2 and the heat sink 53 is further improved. In addition, the low thermal conductive member 61 can comprise, as briefly described above, an appropriate member having the function of sealing and the function of thermal insulation. Also, in the case where the low thermal conductive member 61 is one that is bad in sealing function, sealing between the mating surfaces is achieved by the same sealing construction as that described in the first embodiment.

Figure 9:
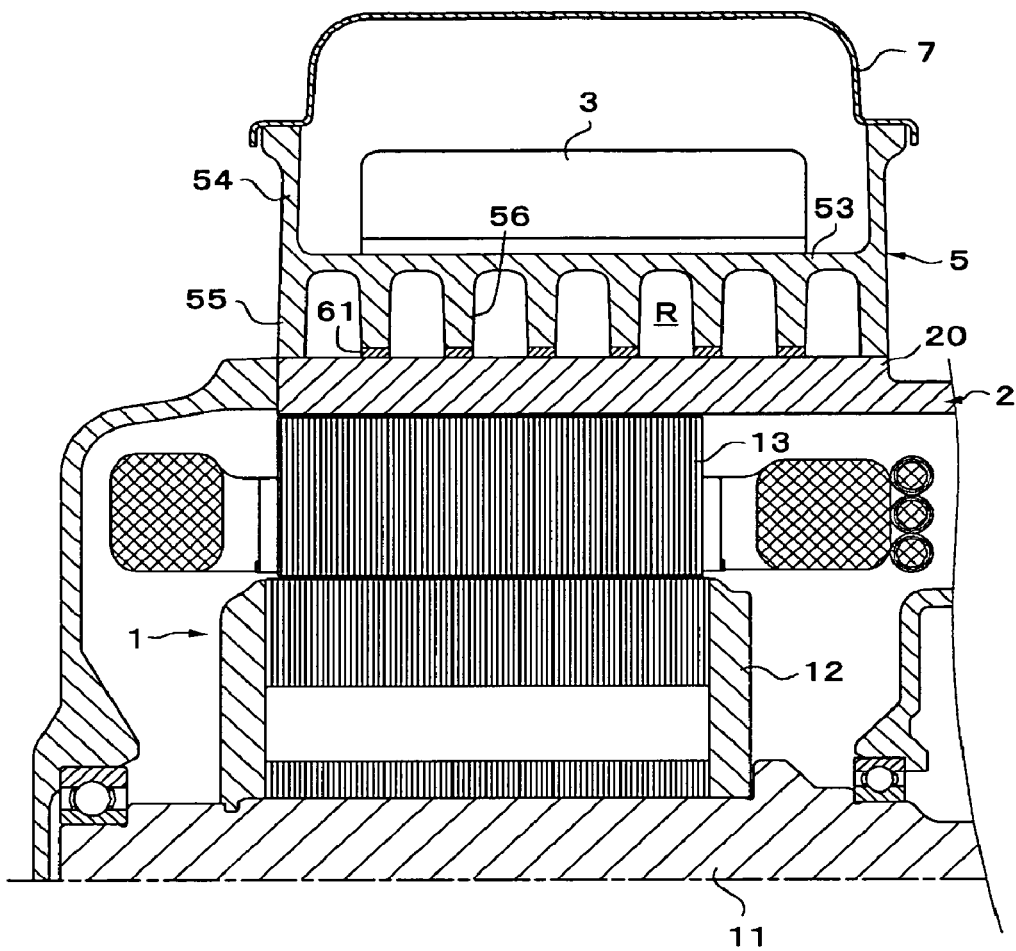
FIG. 9 is a longitudinal, cross sectional view, in an axial direction, of a drive unit according to a fourth embodiment.

Next, FIG. 9 shows a fourth embodiment that is also the same in fundamental construction as the second and third embodiments described previously. This embodiment is the same as the second embodiment in that a heat sink 53 comprises heat-sink side fins 56 extending into a space R toward a drive unit casing 2, a low thermal conductive member 61 made of a material of low thermal conductivity is provided in the space R, and both the heat-sink side fins 56 and the drive unit casing 2 contact directly with the low thermal conductive member 61, but the low thermal conductive member 61 is shaped to follow contact portions of the heat-sink side fins 56 and the drive unit casing 2. While this construction is inappropriate in the case where the fins 56 comprise pin-shaped fins, it is suited to the same rib-shaped or flow passage constituting wall arrangement as the patterns of arrangement described previously with reference to FIG. 4 or FIG. 5. In this case, since the low thermal conductive member 61 follows the shape of fin tip ends, fixation of the low thermal conductive member to the fin tip ends by means of an adhesive is effective in assembling the inverter casing 5 to the drive unit casing 2.

Figure 10:
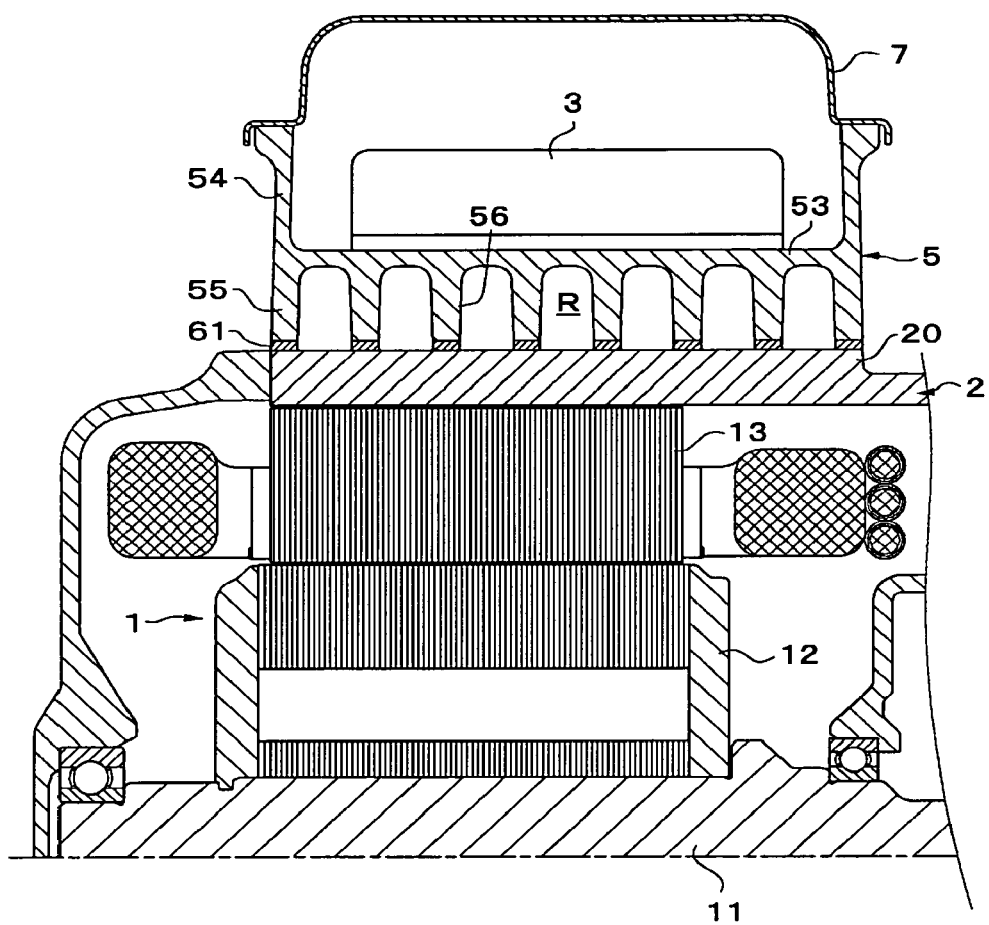
FIG. 10 is a longitudinal, cross sectional view, in an axial direction, of a drive unit according to a fifth embodiment.

Next, like the relationship of the third embodiment with the second embodiment, a fifth embodiment shown in FIG. 10 is related to the fourth embodiment such that a low thermal conductive member 61 is also provided along and arranged on an outer surface of a drive unit casing 2 and a mating surface of an inverter casing 5. Also, in the case where such construction is adopted, heat transfer in abutting areas of a mount surface 20 of the drive unit casing 2 and an end surface of an inverter-casing peripheral wall 55 is cut off by the low thermal conductive member 61, so that the thermal shielding effect between the drive unit casing 2 and the heat sink 53 is further improved. In addition, the low thermal conductive member 61 can also comprise, as briefly described above, an appropriate member having the function of sealing and the function of thermal insulation. Also, in the case where the low thermal conductive member 61 is one that is not adequate in sealing function, the sealing construction described above can be adopted.

Figure 11:
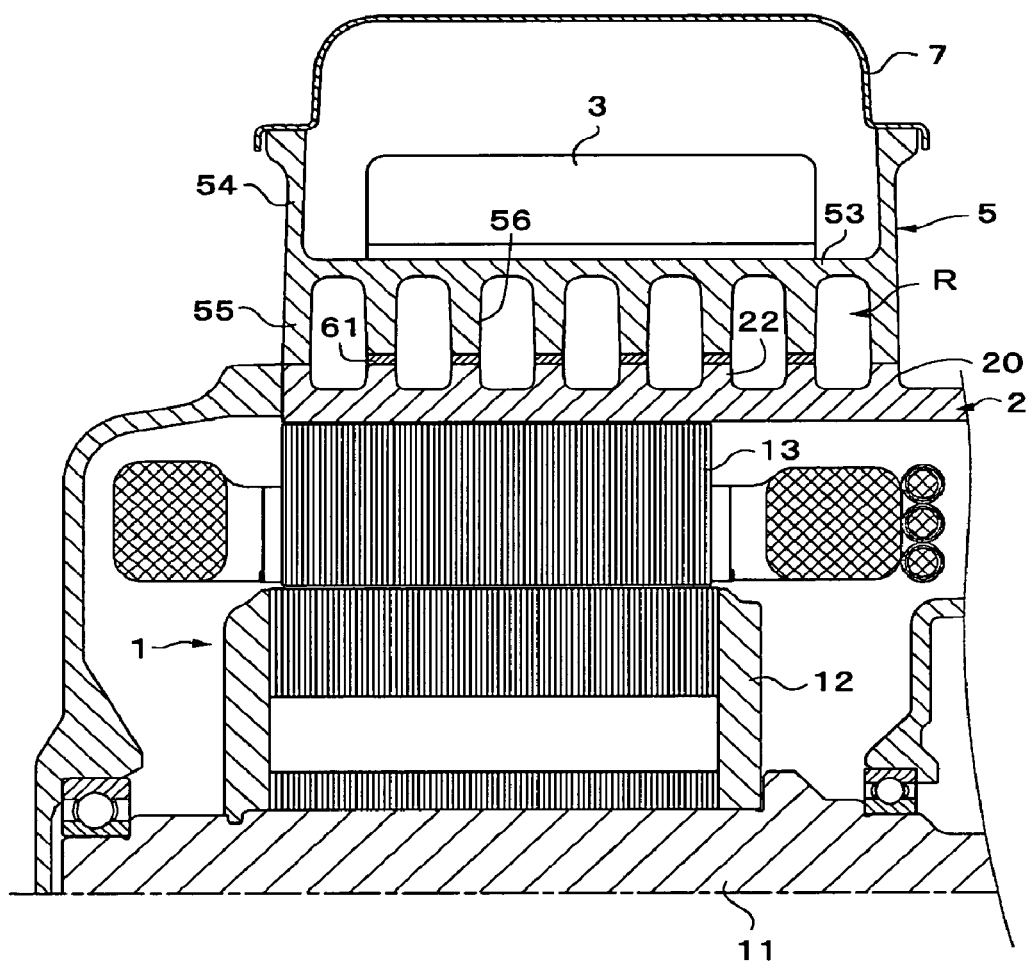
FIG. 11 is a longitudinal, cross sectional view, in an axial direction, of a drive unit according to a sixth embodiment.

Unlike the respective embodiments described above, according to a sixth embodiment shown in FIG. 11, a drive unit casing 2 comprises drive-unit-casing side fins 22 extending into a space R toward a heat sink 53. In this embodiment, both heat-sink side fins 56 and the drive-unit-casing side fins 22 contact directly with a low thermal conductive member 61 so as to cooperatively generate a common refrigerant flow pattern within the space R. In this case, the low thermal conductive member 61 is shaped to follow contact portions of the heat-sink side fins 56 and the drive-unit-casing side fins 22 in the same manner as in the fourth embodiment. And, the both fins are configured to comprise fins in the rib-shaped or flow passage constituting wall arrangement described previously.

In this manner, in the case where the fins 22 are also provided on the drive unit casing 2, a large contact area with the refrigerant flow can be taken on a side of the drive unit casing 2, so that the drive unit casing 2 can be enhanced in cooling effect. Also, with this construction, a common refrigerant flow pattern is generated within the space R by the both fins 56, 22 that contact with each other through the low thermal conductive member 61, so that it is possible to prevent stagnation due to interference of the refrigerant flow from being generated.

Figure 12:
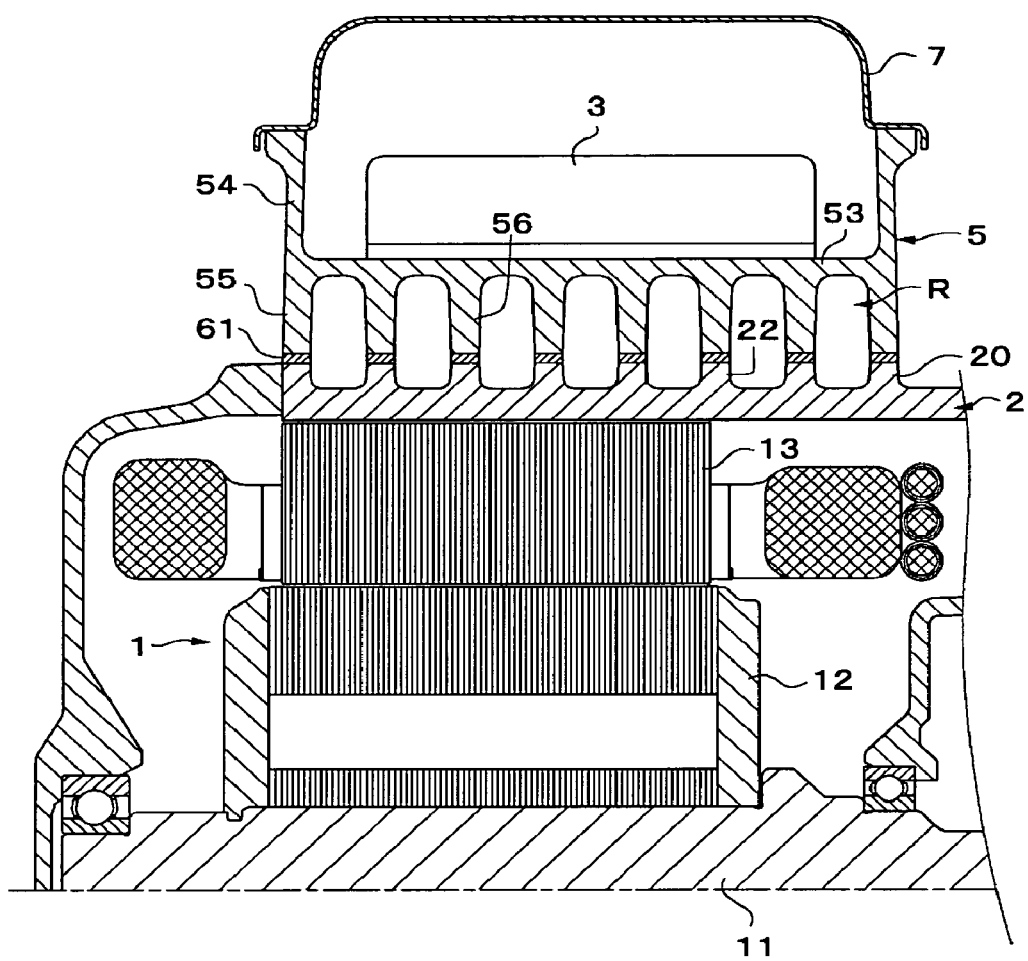
FIG. 12 is a longitudinal, cross sectional view, in an axial direction, of a drive unit according to a seventh embodiment.

Next, like the relationship between the second embodiment and the third embodiment, a seventh embodiment shown in FIG. 12 is a modification of the sixth embodiment. In this case, a low thermal conductive member 61 is also provided along and arranged on mating surfaces of a mount surface 20 of a drive unit casing 2 and an inverter casing 5. In the case where such construction is adopted, heat transfer on abutting areas of the mount surface 20 of the drive unit casing 2 and an end surface of an inverter-casing peripheral wall 55 is cut off by the low thermal conductive member 61, so that the thermal shielding effect between the drive unit casing 2 and the heat sink 53 is further improved. In addition, the low thermal conductive member 61 can comprise, as briefly described above, an appropriate member having the function of sealing and the function of thermal insulation. Also, in the case where the low thermal conductive member 61 is one that is not adequate in sealing function, the sealing construction described above is applied.

Figure 13:
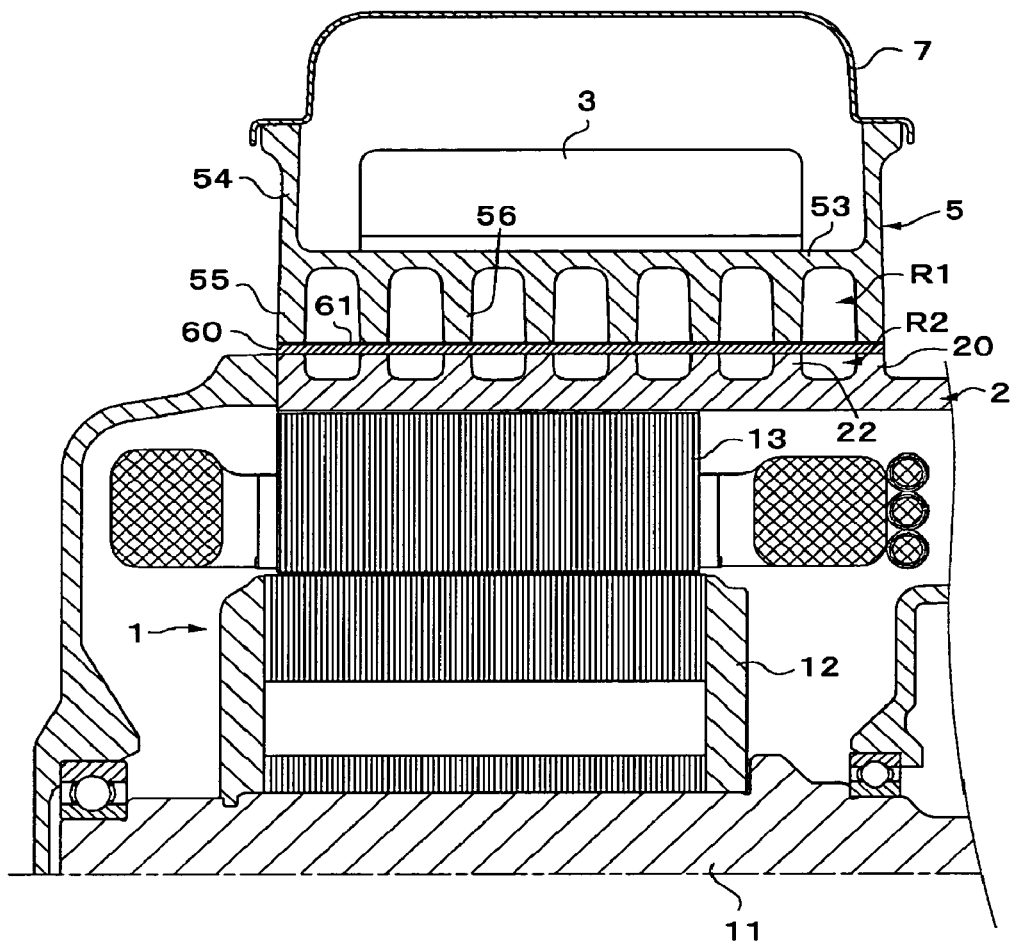
FIG. 13 is a longitudinal, cross sectional view, in an axial direction, of a drive unit according to an eighth embodiment.

Next, an eighth embodiment shown in FIG. 13 adopts, like the seventh embodiment described above, a construction, in which a drive unit casing 2 also comprises drive-unit-casing side fins 22 extending into a space R toward a heat sink 5 and a low thermal conductive member 61 together with a separation member 60 compartments the space R into a first chamber R1 facing the heat sink 5 and a second chamber R2 facing the drive unit casing 2. In this case, while the low thermal conductive member 61 can be arranged singly in the case where it is plate-shaped and it itself can be maintained in shape in the same manner as in the third embodiment described above with reference to FIG. 8 and such construction can be of course adopted, film or coating that by itself cannot be maintained in shape is assumed in the present embodiment and so the low thermal conductive member is provided in combination with the plate-shaped separation member 60 that serves as a backing member for maintaining the shape.

In this embodiment, the low thermal conductive member 61 and the separation member 60 have an external dimension to cover both a mating surface of a mount surface 20 and the second chamber R2 on a drive unit casing 2 side and cover both an end surface of a peripheral wall 55 and the first chamber R1 on a heat sink 5 side, and are interposed between facing portions of the drive unit casing 2 and the inverter casing 5. While the low thermal conductive member 61 is provided along only one surface of the separation member 60 as shown in the figure, a construction is also of course possible, in which low thermal conductive members are provided along both surfaces of the separation member 60.

Also, in this embodiment, heat transfer on mating surfaces of the drive unit casing 2 and the inverter casing 5, that is, abutting areas of the mount surface 20 of the drive unit casing 2 and an end surface of an inverter-casing peripheral wall 55 is cut off by the low thermal conductive member 61, so that the thermal shielding effect between the drive unit casing 2 and the heat sink 53 is further improved. In addition, the low thermal conductive member 61 and the separation member 60 can comprise, as briefly described above, appropriate members having the function of sealing and the function of thermal insulation. Also, in the case where the low thermal conductive member 61 and the separation member 60 are ones that are bad in sealing function, the sealing construction described above is applied.

In this manner, in the case where the construction is adopted, in which the space R is compartmented into the first chamber R1 facing the heat sink 5 and the second chamber R2 facing the drive unit casing 2, it is unnecessary to take account of interference of refrigerant flows flowing through the both chambers R1, R2, so that a refrigerant flow pattern in this embodiment can be varied.

Figure 14:
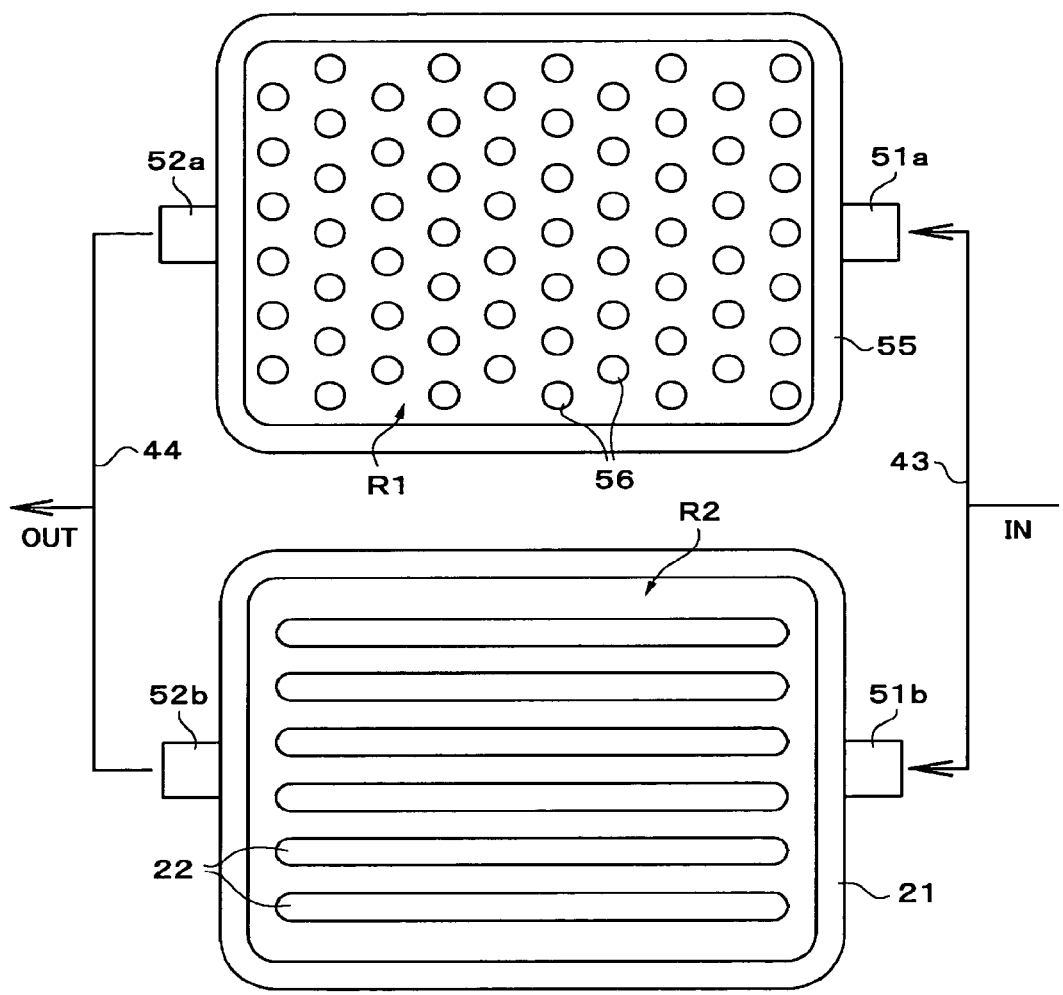
FIG. 14 is a schematic plan view showing a fin arrangement pattern according to the eighth embodiment, in which facing surfaces of a heat sink and a drive unit casing are aligned in the same plane.

Next, FIG. 14 shows, in schematic plan, a fin arrangement pattern adoptable in the embodiment, in which heat-sink side fins 56 and drive-unit-casing side fins 22 are arranged, and a bottom surface of the heat sink 5 and a mount surface on the side of the drive unit casing 2 actually in the opposed relationship with each other are aligned in the same plane. In this case, the heat-sink side fins 56 extending into the first chamber R1 comprise pin-shaped fins so as to reduce pressure loss in flow passages and the drive-unit-casing side fins 22 comprise rib-shaped fins. Also, in the case where a construction, in which the space R is compartmented, is adopted in this manner, how the respective chambers are connected to a refrigerant circulating path is problematic. In this embodiment, inlet ports 51a, 51b of the respective chambers are simply connected to a discharge-side flow passage 43 and outlet ports 52a, 52b are connected to a return flow passage 44, thus the both chambers being connected to the refrigerant circulating path in parallel relationship.

In the case where such fin arrangement pattern and such connection to the flow passages are adopted, flow resistance is smaller on a side of the first chamber R1 than on a side of the second chamber R2, so that the flow rate on the side of the first chamber R1 becomes relatively large and so cooling of an inverter 3 and the drive unit casing 2 can be efficiently carried out with less flow rate by increasing the cooling capacity on a side of the heat sink 53 to provide temperature gradient between the both chambers according to a low heat-resistant temperature of the inverter 3.

Figure 15:
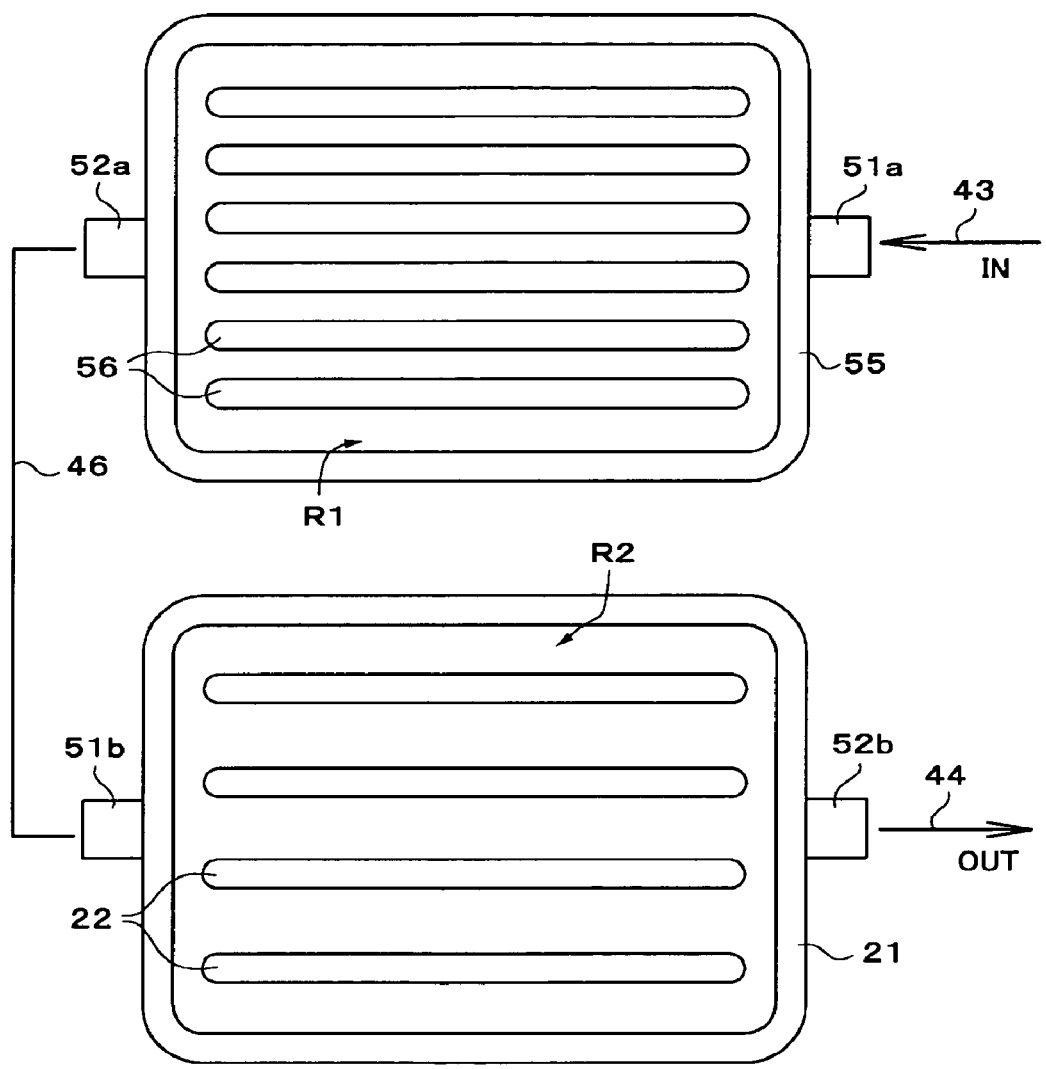
FIG. 15 is a schematic plan view showing another fin arrangement pattern according to the eighth embodiment, in which facing surfaces of a heat sink and a drive unit casing are aligned in the same plane.

Next, FIG. 15 shows a modification, in which the fin arrangement pattern and the relationship of connection with the refrigerant circulating path are further changed, in the same manner as in FIG. 14. In this case, both the heat-sink side fins 56 extending into the first chamber R1 and the drive-unit-casing side fins 22 extending into the second chamber R2 comprise rib-shaped fins, while the heat-sink side fins 56 are arranged at smaller intervals than that for the drive-unit-casing side fins 22. Also, in this modification, the inlet port 51a of the first chamber R1 is connected to the discharge-side flow passage 43, the outlet port 52a is connected to the inlet port 51b of the second chamber R2 via a connection flow passage 46, the outlet port 51b of the second chamber R2 is connected to the return flow passage 44, and thus the both chambers are connected in series to the refrigerant circulating path.

In the case where such fin arrangement pattern and such connection to the flow passages are adopted, a cooling area on the side of the first chamber R1 is larger than that on the side of the second chamber R2 even when the both chambers R1, R2 are equal to each other in thickness, so that a cooling effect on the side of the first chamber R1 becomes relatively large. Accordingly, making use of the above, cooling of the inverter 3 and the drive unit casing 2 can be efficiently carried out with less flow rate in the same manner as described above by increasing the cooling capacity on a side of the heat sink 53 to provide temperature gradient between the both chambers according to a low heat-resistant temperature of the inverter 3.

Figure 16:
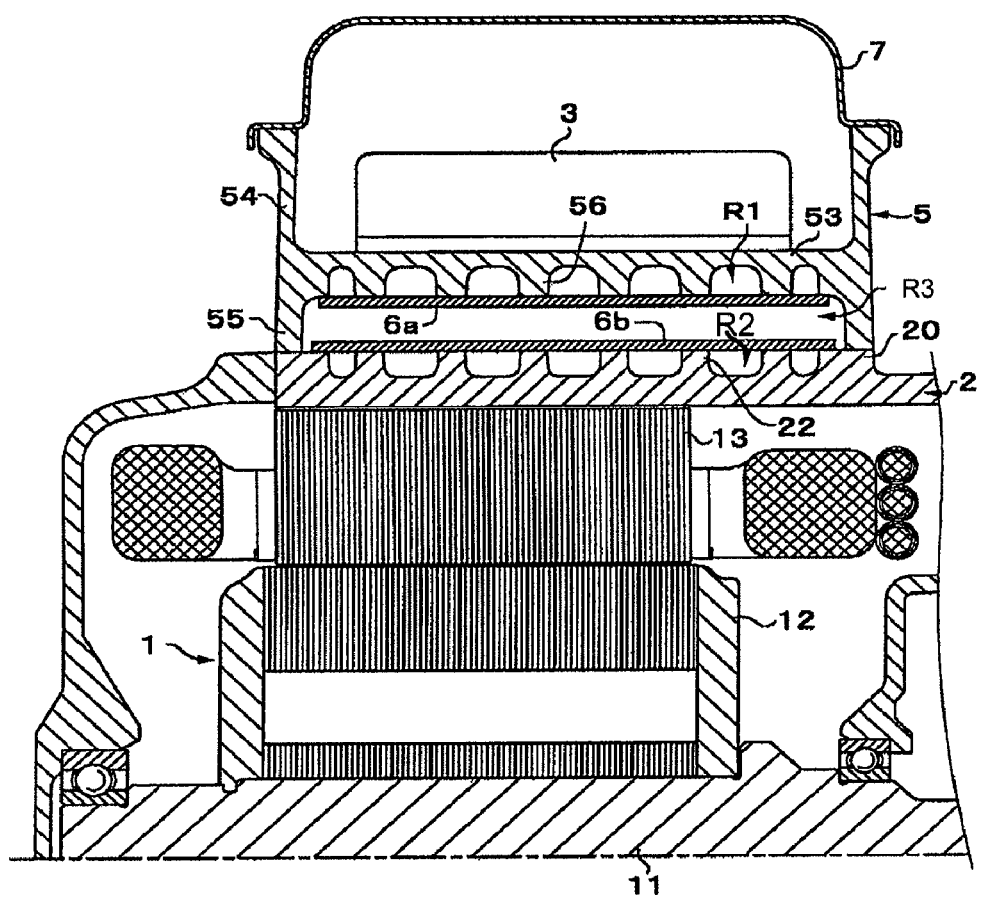
FIG. 16 is a longitudinal, cross sectional view, in an axial direction, of a drive unit according to a ninth embodiment.

Next, a ninth embodiment shown in FIG. 16 adopts, like the eighth embodiment described above, a construction, in which a drive unit casing 2 also comprises drive-unit-casing side fins 22 extending into a space R toward a heat sink 5, separation means 6a, 6b composed of two layers are provided in the space to compartment the space into a first chamber R1 facing toward a heat sink 53, a second chamber R2 facing toward the drive unit casing 2, and a third chamber R3 as a space between the both chambers, and both heat-sink side fins 56 and the drive-unit- casing side fins 22 contact directly with the respective separation means 6a, 6b. In this embodiment, the separation means 6a, 6b may comprise the separation member 60, the low thermal conductive member 61 in the respective embodiments, or a laminate thereof. Also, in this embodiment, it is required that at least the first chamber R1 and the second chamber R2 be communicated to the refrigerant flow passages, but the third chamber R3 may be simply a closed space or a space opened to the atmosphere, the space being not communicated to the refrigerant flow passages.

A fin arrangement and a refrigerant flow that are adoptable in this embodiment can be made the same as those described in the eighth embodiment with reference to FIGS. 14 and 15 in the case where the third chamber R3 is a simple space. Also, in the case where the third chamber R3 is to be also communicated to the refrigerant flow passages, all the respective chambers may be connected in parallel to the flow passages as inferred from the parallel connection described with reference to FIG. 14, and connection in series may be provided in view of temperature gradient so as to allow the refrigerant to flow through the first chamber R1, the second chamber R2, and the third chamber R3 in this order, as inferred from the connection in series described with reference to FIG. 15.

Figure 17:
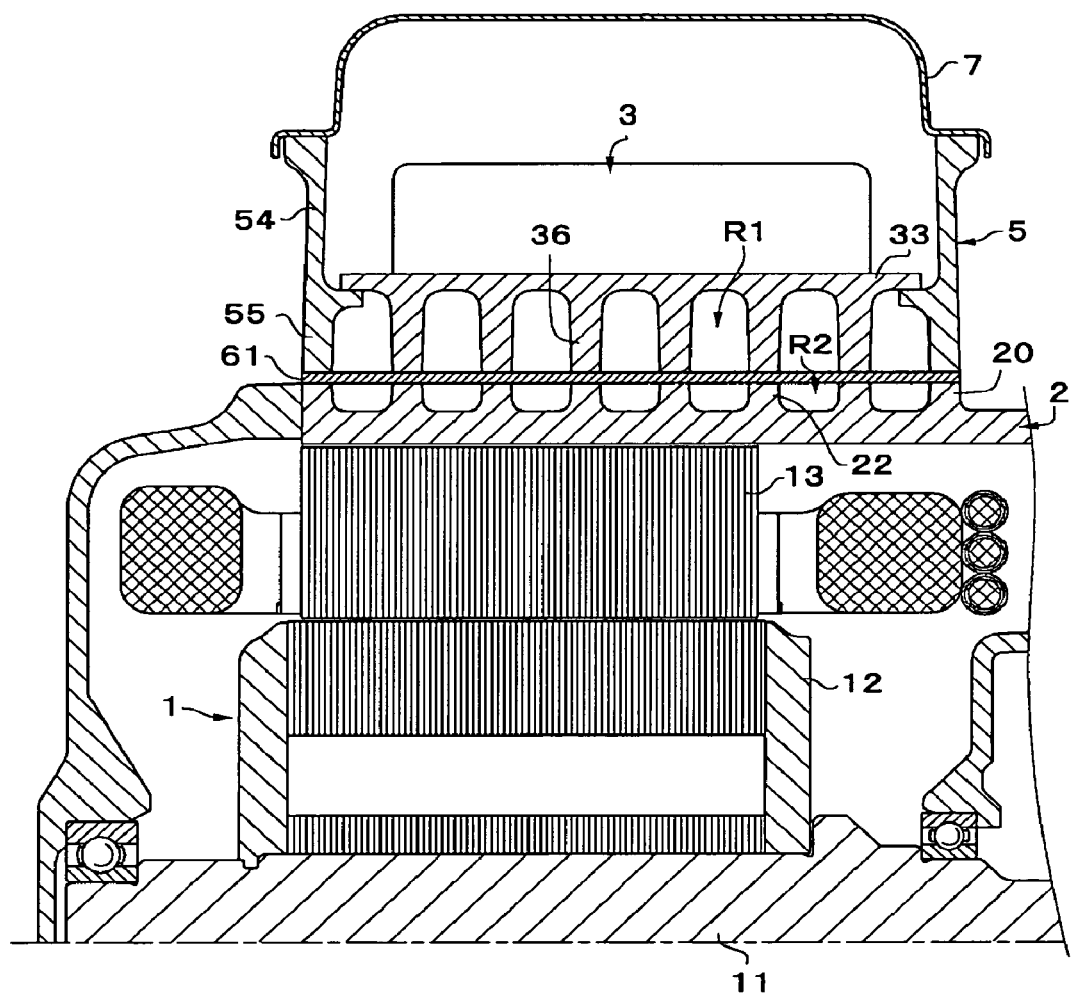
FIG. 17 is a longitudinal, cross sectional view, in an axial direction, of a drive unit according to a tenth embodiment.

Finally, a tenth embodiment shown in FIG. 17 assumes, unlike the respective embodiments described above, the case where an inverter 3 is united with a heat sink 33, or a substrate itself of an inverter 3 is constituted as an inverter module that constitutes a heat sink 33. In this embodiment, the inverter 3 together with the heat sink 33 that is united with a substrate thereof are received and fixed in an inverter casing 5 composed of a separate member from the inverter. And, since the heat sink 33 and the inverter casing 5 are separate from each other, appropriate sealing means, illustration of which is omitted, seals between them.

While the invention has been described above in detail on the basis of ten embodiments, it is not limited to such embodiments but can be embodied with its concrete construction modified variously within the scope described in the claims. For example, the low thermal conductive member 6 except that in the eighth embodiment is assumed to comprise a member itself having a certain degree of rigidity. However, in the case where the low thermal conductive member 61 comprises a film-shaped member or coating itself having no rigidity, it is possible to adopt a construction, in which the low thermal conductive member is provided along separation means made of an appropriate material such as metallic material, ceramic material, rubber, etc. In this case, the low thermal conductive member 61 may be provided along one surface of the separation means or both surfaces thereof. Also, in the case where the low thermal conductive member 61 is shaped to follow contact portions of the heat-sink side fins 56 and the drive-unit-casing side fins 22, the low thermal conductive member 61 does not necessarily require self-rigidity but can be composed of a film-shaped member or coating. Also, while the refrigerant exclusively composed of cooling water is illustrated, it is of course possible to use other appropriate refrigerants.

INDUSTRIAL APPLICABILITY

The invention is widely applicable to apparatuses, in which an electric motor and an inverter are united together, as well as drive units for electric cars and hybrid drive units.

The invention claimed is:

1. A drive unit including
an electric motor,
a drive unit casing accommodating therein the electric motor,
an inverter that controls the electric motor, and
a flow passage of a refrigerant that cools the inverter, the drive unit characterized in that the inverter is mounted on the drive unit casing such that a heat sink united with a substrate of the inverter defines a space on a portion thereof opposed to the drive unit casing,
the space is communicated to the flow passage of the refrigerant,
the heat sink comprises heat-sink side fins extending into the space toward the drive unit casing,
separation means (6) for preventing thermal conduction is provided in the space, wherein the separation means comprises a plurality of separation members (60) with a space (R3) there between, and
both the heat-sink side fins and the drive unit casing contact directly with the separation means.

2. A drive unit including
an electric motor,
a drive unit casing accommodating therein the electric motor,
an inverter that controls the electric motor, and
a flow passage of a refrigerant that cools the inverter, the drive unit characterized in that the inverter is mounted on the drive unit casing such that a heat sink united with a substrate of the inverter defines a space on a portion thereof opposed to the drive unit casing,
the space is communicated to the flow passage of the refrigerant,
the heat sink comprises heat-sink side fins extending into the space toward the drive unit casing,
the drive unit casing comprises drive-unit-casing side fins extending into the space toward the heat sink,
separation means (6) for preventing thermal conduction is provided in the space, wherein the separation means comprises a low thermal conductive member (61), wherein the low thermal conductive member is shaped to follow contact portions of the heat-sink side fins and the drive-unit-casing side fins, and
both the heat-sink side fins and the drive unit casing contact directly with the separation means, such that both the heat-sink side fins and the drive unit side fins cooperatively generate a common refrigerant flow pattern.

* * * * *